United States Patent [19]
Manning

[11] Patent Number: 5,214,295
[45] Date of Patent: May 25, 1993

[54] THIN FILM FIELD EFFECT TRANSISTOR, CMOS INVERTER, AND METHODS OF FORMING THIN FILM FIELD EFFECT TRANSISTORS AND CMOS INVERTERS

[75] Inventor: Monte Manning, Kuna, Id.

[73] Assignee: Micron Technology, Inc., Boise, Id.

[21] Appl. No.: 827,287

[22] Filed: Jan. 28, 1992

[51] Int. Cl.$^5$ .................... H01L 27/01; H01L 21/265
[52] U.S. Cl. ........................ 257/67; 257/369;
257/377; 437/41; 437/44; 437/57; 437/106;
437/153; 437/186; 437/915; 437/200
[58] Field of Search ................ 357/23.7; 437/41, 44,
437/57, 106, 153, 186, 200, 915; 257/67, 369, 377

[56] References Cited

U.S. PATENT DOCUMENTS 4,814,841  3/1989  Masuoka et al. .................... 357/23.7
4,980,732 12/1990  Okazawa ............................. 357/23.7

OTHER PUBLICATIONS

A. O. Adan, et al., "Leakage Current In Polysilicon MOS Thin-Film Transistors and an Optimum Self-Aligned Structure for High Density SRAMs," Date Unknown.
M. Ando, et al., "A 0.1 uA Standby Current, Bouncing-Noise-Immune 1 Mb SRAM," IEEE Journ. of Solid State Circuits, pp. 1708-1713, Dec. 1989.
Ikeda et al., "A Polysilicon Transistor Technology For Large Capacity SRAMs," IEDM 1990, pp. 469-472.
H. Chkubo et al., "16 Mbit SRAM Cell Technologies for 2.0 V Operation," NEC Corporation, Date Unknown.

Primary Examiner—Edward Wojciechowicz
Attorney, Agent, or Firm—Wells, St. John, Roberts, Gregory & Matkin

[57] ABSTRACT

Disclosed herein is a thin film field effect transistor and a method for producing such a thin film transistor. The thin film transistor has a transistor gate and thin film active and channel regions. The transistor gate has a top surface and sidewalls which are coated with a thin gate insulating layer. A thin semiconductor film is provided over the transistor gate and thin gate insulating layer to form a conductively doped thin film channel region and conductively doped thin film active regions. The thin film channel region contacts the thin gate insulating layer opposite the transistor gate top surface and opposite the sidewalls. The transistor gate sidewalls in operation gate the opposite thin film channel region through the thin gate insulating layer. The thin film field effect transistor can be fabricated over an underlying MOSFET to form a CMOS inverter with the transistor gate being common to both the thin film transistor and the MOSFET. In this configuration the thin film channel region contacts the thin gate insulating layer opposite an underlying MOSFET active region. The underlying active region in operation gates the opposite thin film channel region through the thin gate insulating layer.

18 Claims, 6 Drawing Sheets 5,214,295

THIN FILM FIELD EFFECT TRANSISTOR, CMOS INVERTER, AND METHODS OF FORMING THIN FILM FIELD EFFECT TRANSISTORS AND CMOS INVERTERS

TECHNICAL FIELD

This invention relates to methods and structures for forming thin film field effect transistors and for aligning channel regions in such thin film transistors.

BACKGROUND OF THE INVENTION

FIG. 1 shows a prior art semiconductor circuit 10 in which a p-channel thin film transistor is formed over an underlying n-channel metal oxide semiconductor field effect transistor (MOSFET). The transistors are connected to form a CMOS inverter.

The underlying MOSFET comprises heavily doped n-type (n+) underlying transistor active regions 12 and 14 formed in a lightly doped p-type (p−) silicon or other semiconductor substrate 16, a channel region 18 in substrate 16 between underlying n+ active regions 12 and 14, and a conductively doped polysilicon gate 20 over channel region 18. Gate 20 has a top surface 22 and sidewalls 24. An underlying gate oxide layer 26 insulates gate 20 and channel region 18 from each other.

Gate 20 functions as a gate for both the MOSFET and the thin film transistor. Spacers 38 are formed along gate sidewalls 24 to a thickness of which is generally over 1000 Angstroms. Spacers 38 are used to create lightly doped regions within underlying MOSFET active regions 12 and 14 beneath spacers 38. The lightly doped regions are created by performing a light implanting or active regions 12 and 14 before spacers 38 are formed on sidewalls 24. A heavier implanting of active regions 12 and 14 is performed after spacers 38 are formed, with spacers 38 blocking or restricting the heavier implanting thereunder.

The thin film transistor comprises gate 20, heavily doped p-type (p+) thin film active regions 30 and 32, and a thin film channel region 34 between thin film active regions 30 and 32. Thin film channel region 34 is slightly offset from transistor gate top surface 22, extending somewhat beyond transistor gate top surface 22. Such an offset reduces leakage current in thin film transistors. Channel region 34 is formed of lightly doped n-type (n−) silicon.

An isolation oxide layer 36 insulates gate 20 and underlying active regions 12 and 14 from thin film active regions 30 and 32 and from thin film channel region 34. Isolation oxide layer 36 typically has a thickness of greater than about 2000 Angstroms over underlying active regions 12 and 14 to isolate the MOSFET from the thin film transistor. Isolation oxide layer 36 is thinner over transistor gate top surface 22 so that gate 20 will gate thin film channel region 34. Isolation oxide layer 36 has a typical thickness over top surface 22 of about 100 Angstroms to about 800 Angstroms.

Underlying active region 12 forms the source of the underlying n-channel MOSFET and is typically connected to $V_{ss}$ or ground. Thin film transistor active region 30 forms the source of the underlying p-channel thin film transistor and is typically connected to $V_{cc}$ or a positive logic voltage. Underlying active region 14 forms the drain of the MOSFET and thin film active region 32 forms the drain of the thin film transistor. The two drains are connected to a common n+ conductive runner 40. Semiconductor circuit 10 thus forms a CMOS inverter. Gate 20 forms the input of the inverter and conductive runner 40 forms the output.

A problem arises in prior art thin film transistors such as described above when the junction between thin film source 30 and thin film channel region 34 is not accurately aligned with gate 20. FIGS. 2 and 3 show examples of inaccurate gate alignment.

In FIG. 2, the junction between thin film source 30 and thin film channel region 34 is located too far in the direction of thin film drain region 32. This alignment results in an offset region, indicated by the reference numeral 50, which is significantly longer than the corresponding optimal offset region of FIG. 1. The longer offset region decreases the transistor's conductivity when turned on.

In FIG. 3, the junction between thin film source 30 and thin film channel region 34 is located too far in the direction of thin film source region 30. A portion of channel region 34, indicated by the reference numeral 52, overlies spacer 38 and is not gated at all. In addition, there is no offset region since the junction between thin film drain region 32 and thin film channel region 34 is directly over gate 20. Without an offset region, the transistor shown in FIG. 3 has a significantly larger leakage current than the transistor shown in FIG. 1.

The invention described below overcomes the misalignment problems mentioned above, while creating a greater effective thin film transistor gate length and a self-aligned thin film transistor source. According to the methods described below, only two layers of polysilicon are required to create a CMOS inverter which utilizes a thin film transistor over an underlying MOSFET.

BRIEF DESCRIPTION OF THE DRAWINGS

A preferred embodiment of the invention is described below with reference to the following accompanying drawings, in which.

DETAILED DESCRIPTION OF THE PREFERRED EMBODIMENTS

This disclosure of the invention is submitted in furtherance of the constitutional purposes of the U.S. Patent Laws "to promote the progress of science and useful arts." U.S. Constitution, Article 1, Section 8.

In accordance with the invention, a method for forming a thin film field effect transistor on a semiconductor substrate comprises the following steps:

forming a transistor gate on a semiconductor substrate, the transistor gate having a top surface and sidewalls;

providing a thin gate insulating layer over the transistor gate, the thin gate insulating layer coating the transistor gate top surface and sidewalls, the thin gate insulating layer having a thickness which is less than about 700 Angstroms; and forming a thin semiconductor film over the transistor gate to a selected thickness, the thin film having a conductively doped thin film channel region and conductively doped thin film active regions, the thin film channel region contacting the thin gate insulating layer opposite the transistor gate top surface and opposite the sidewalls, the transistor gate sidewalls in operation gating the opposite thin film channel region through the thin gate insulating layer.

FIGS. 4-10 illustrate in more detail a method of this invention for forming a thin film field effect transistor on a semiconductor substrate. In the preferred embodiment shown and described, a thin film transistor of one conductivity type is formed over an underlying MOSFET of the opposite conductivity type to form a CMOS inverter. Those familiar with semiconductor technology, however, will realize that many advantages of the thin film transistor construction described below may be realized even in the absence of the underlying MOSFET.

Figure 1:
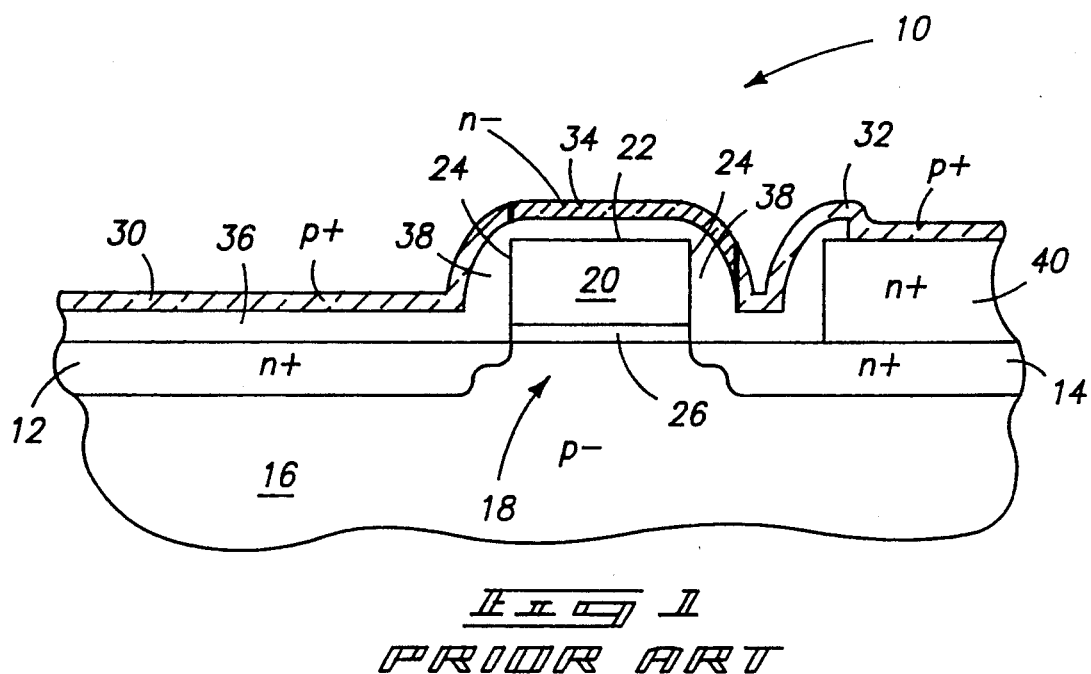
FIG. 1 is a diagrammatic section view of a portion of a CMOS circuit in accordance with the prior art, and is described in the "Background" section above.
Figure 2:
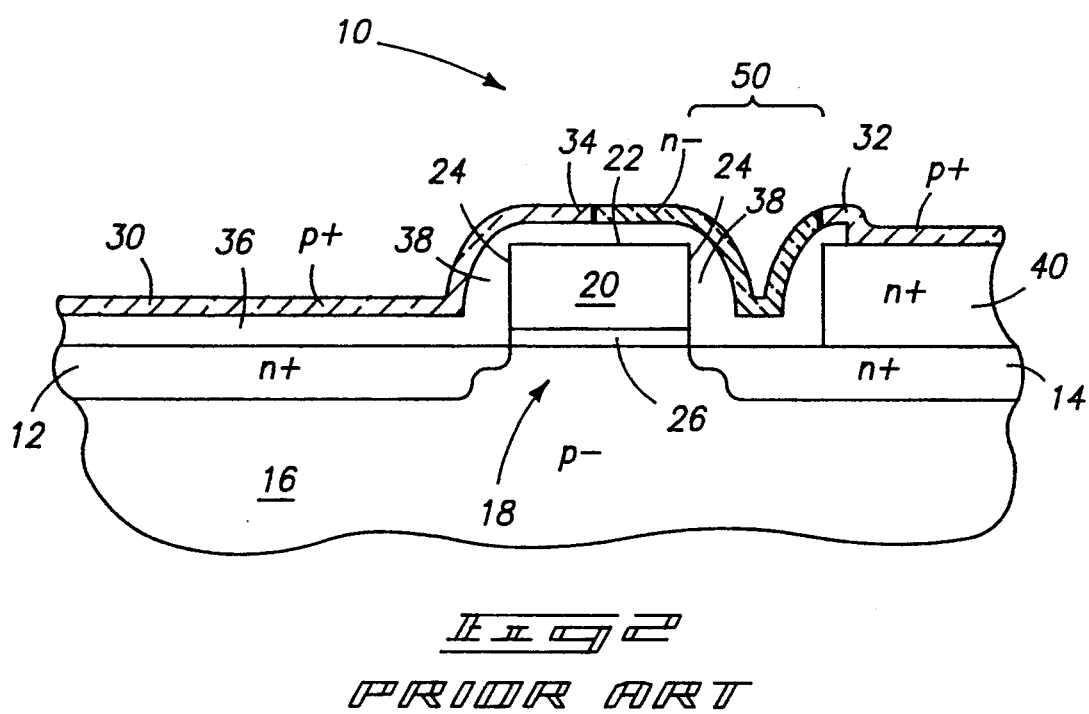
FIG. 2 is a diagrammatic section view of a portion of the CMOS circuit shown in FIG. 1 wherein the thin film gate is misaligned in relation to the transistor gate.
Figure 3:
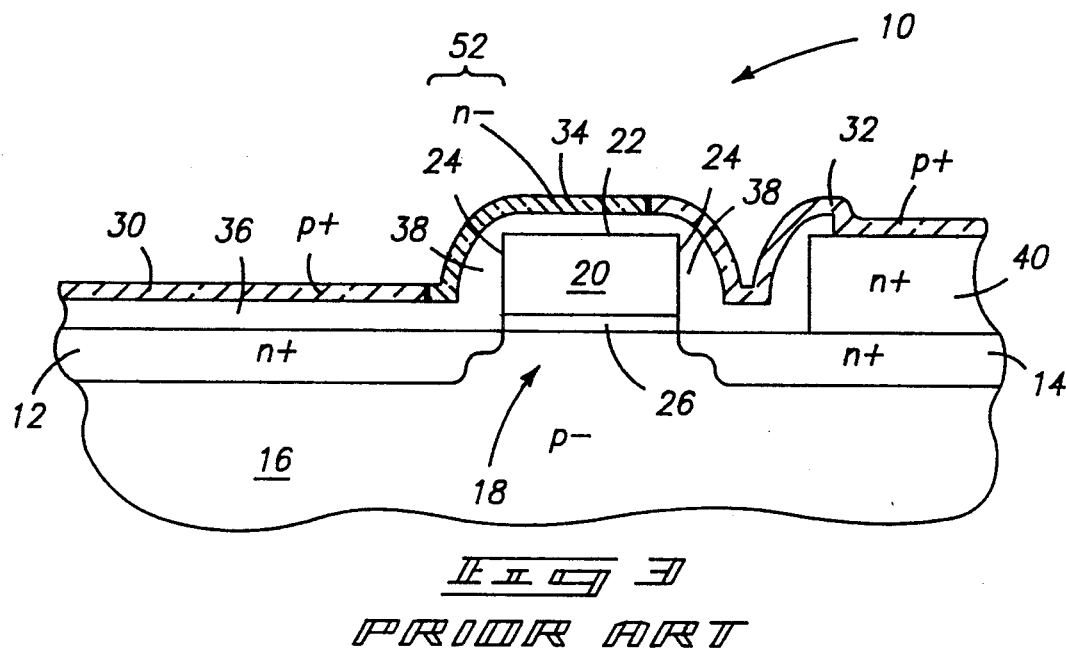
FIG. 3 is a diagrammatic section view of a portion of the CMOS circuit shown in FIG. 1 wherein the thin film gate is misaligned in relation to the transistor gate.
Figure 4:
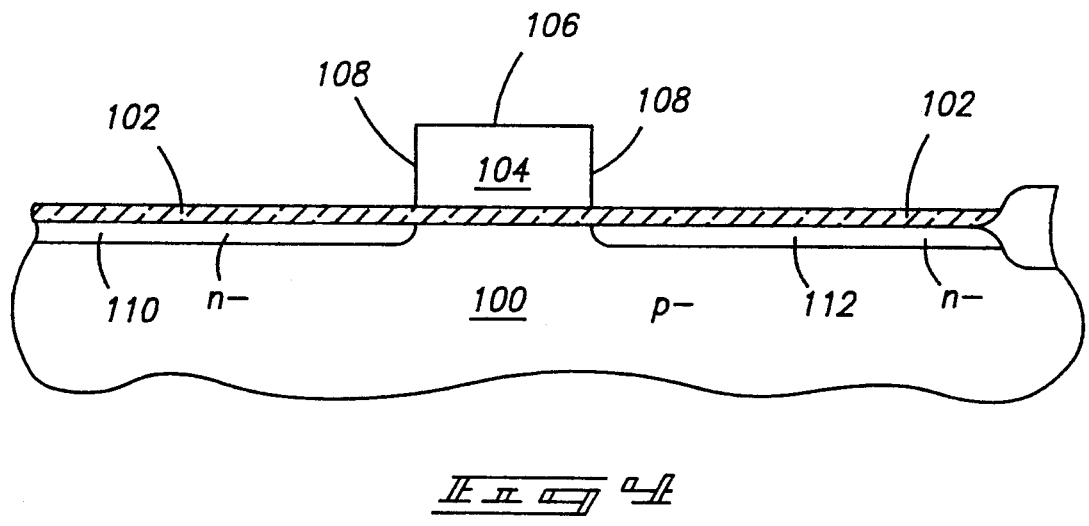
FIG. 4 is a diagrammatic section of portion of a preferred CMOS circuit in accordance with the invention, the circuit being shown at an initial processing step.

An underlying n-channel MOSFET is initially formed in a p-type substrate, largely in accordance with conventional processing steps. FIG. 4 shows an initial step wherein an underlying gate oxide layer 102 has been provided over a lightly doped p-type (p−) silicon or other semiconductor substrate 100 to a preferred thickness of about 150 Angstroms. A polysilicon transistor gate 104 having a top surface 106 and at least one sidewall 108 has also been formed on semiconductor substrate 100 over underlying gate oxide layer 102. A doping or implanting with an n-type impurity such as phosphorus has been performed with a light implanting dose, preferably about $10^{14}$ ions/cm$^2$ at 30 KeV, to create lightly doped portions of an underlying transistor active or source region 110 and an underlying transistor active or drain region 112.

Figure 5:
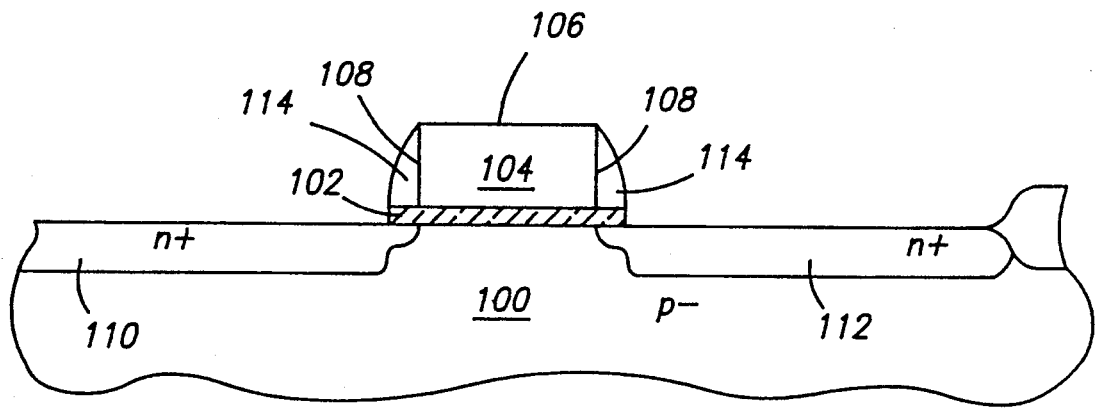
FIG. 5 is a diagrammatic section of a preferred CMOS circuit in accordance with the invention, the circuit being shown at a processing step subsequent to that illustrated in FIG. 4.

Referring to FIG. 5, insulating spacers 114 are subsequently provided adjacent transistor gate sidewalls 108. In contrast to the prior art, spacers 114 are sacrificial and are provided only to aid in creation of lightly doped regions within underlying transistor active regions 110 and 112. Spacers 114 are created by first applying a thick layer of insulating material (not shown) over substrate 100 and then patterning and etching the insulating material and the underlying areas of gate oxide layer 102. The insulating material is preferably a nitride, ozone TEOS, or another material which can be removed with good selectivity to the oxide of gate oxide layer 102. This allows spacers 114 to be subsequently removed without damage to gate oxide layer 102.

Active regions 110 and 112 are then doped or implanted again with an n-type impurity such as arsenic, this time at a heavier implanting dose, preferably about 4 times $10^{15}$ ions/cm$^2$ at 100 KeV. Sacrificial insulating spacers 114 block or restrict doping thereunder, forming heavily doped portions of active regions 110 and 112. Active regions 110 and 112 are therefore lightly doped near transistor gate 104 and heavily doped away from transistor gate 104. Transistor gate 104 and underlying transistor source and drain regions 110 and 112 form the underlying MOSFET.

Figure 6:
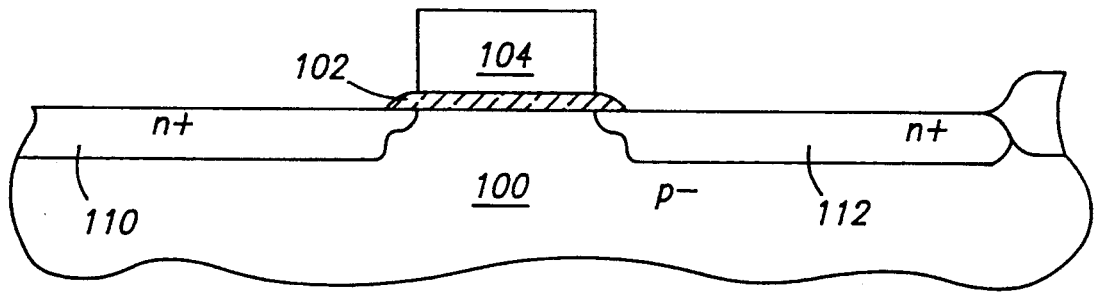
FIG. 6 is a diagrammatic section of a preferred CMOS circuit in accordance with the invention, the circuit being shown at a processing step subsequent to that illustrated in FIG. 5.

After the formation of the underlying MOSFET as described above, sacrificial insulating spacers 114 are etched and substantially removed as shown in FIG. 6. The etching which removes spacers 114 is preferably selective to gate oxide layer 102 to prevent damage to gate oxide layer 102. Extending portions of gate oxide layer 102 therefore remain over active regions 110 and 112 near transistor gate 104. These extending portions are preferably removed with a dry etching process, although in some instances their removal may be unnecessary because of the negligible thickness of gate oxide layer 102.

Figure 7:
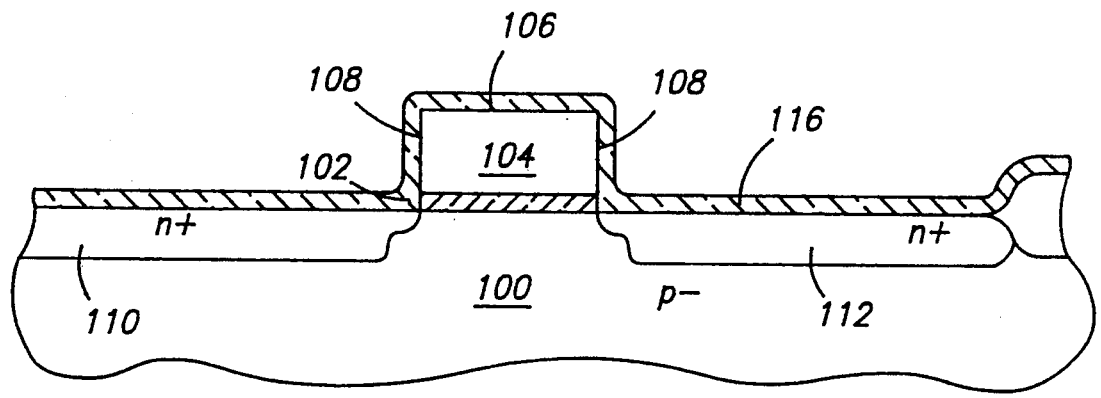
FIG. 7 is a diagrammatic section of a preferred CMOS circuit in accordance with the invention, the circuit being shown at a processing step subsequent to that illustrated in FIG. 6.

Subsequent to removing sacrificial insulating spacers 114, a thin gate insulating layer 116 is conformally deposited or otherwise provided as shown in FIG. 7. Thin gate insulating layer 116 coats top surface 106 and sidewalls 108 of transistor gate 104 while also overlying and contacting underlying source and drain regions 110 and 112. Thin gate insulating layer 116 has a thickness which is preferably less than about 700 Angstroms and greater than about 100 Angstroms.

Figure 8:
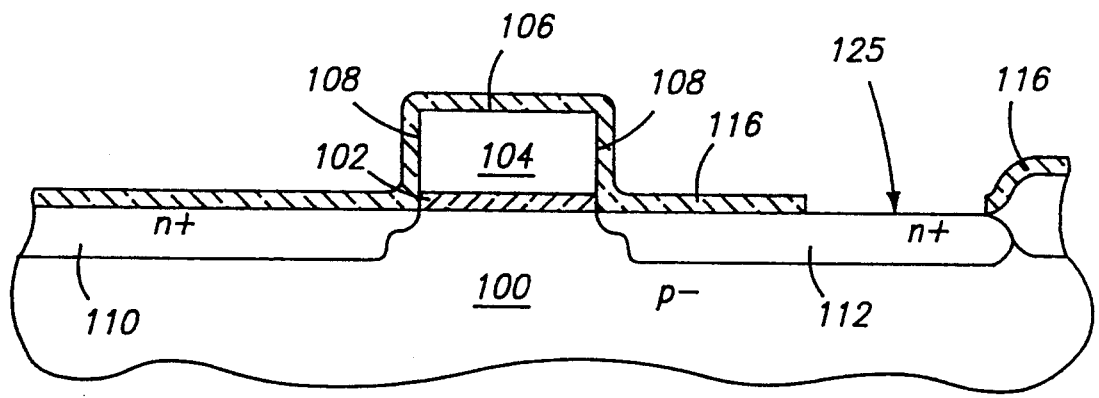
FIG. 8 is a diagrammatic section of a preferred CMOS circuit in accordance with the invention, the circuit being shown at a processing step subsequent to that illustrated in FIG. 7.
Figure 9:
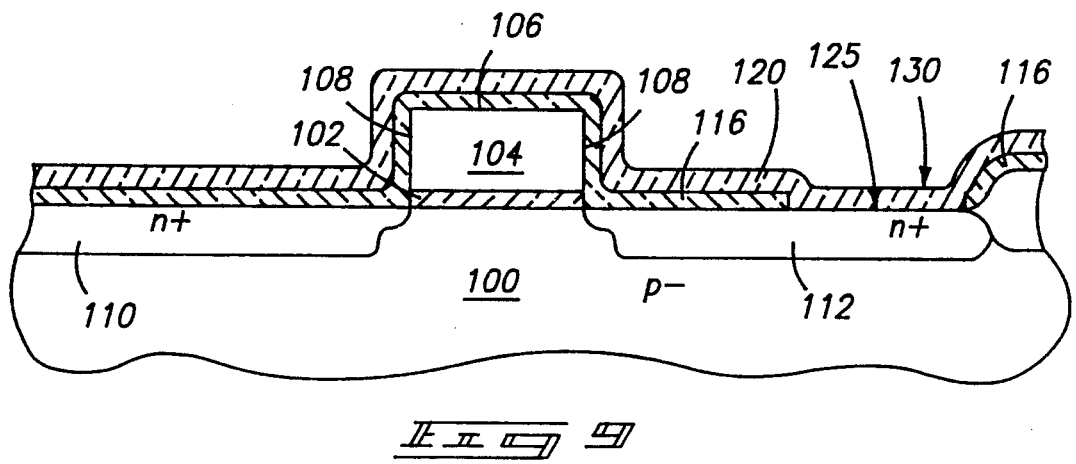
FIG. 9 is a diagrammatic section of a preferred CMOS circuit in accordance with the invention, the circuit being shown at a processing step subsequent to that illustrated in FIG. 8.
Figure 10:
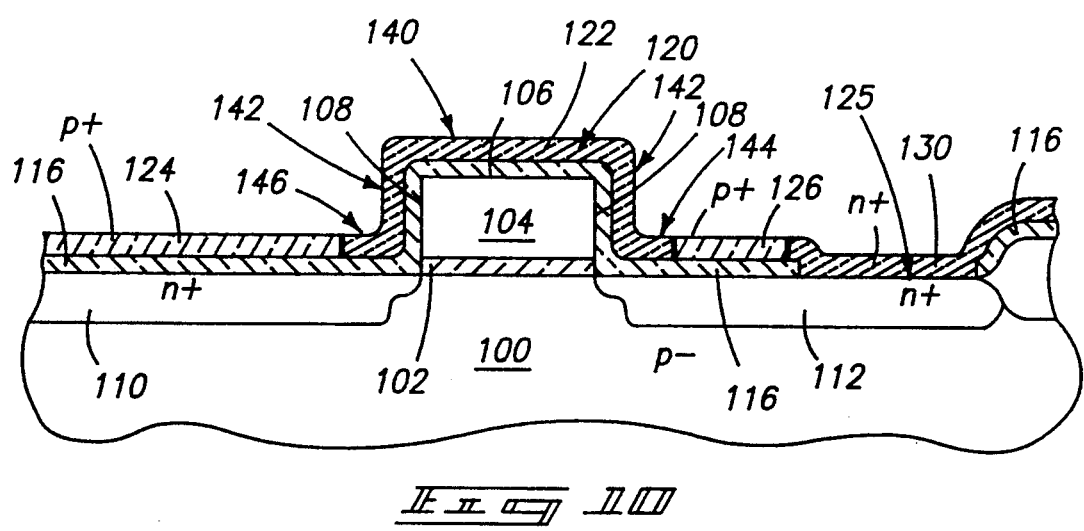
FIG. 10 is a diagrammatic section of a preferred CMOS circuit in accordance with the invention, the circuit being shown at a processing step subsequent to that illustrated in FIG. 9.

Referring now to FIGS. 8-10, thin gate insulating layer 116 is patterned and etched, forming an exposed underlying drain area 125. A thin polysilicon semiconductor film 120 is conformally deposited or otherwise provided to a selected thickness over transistor gate 104 and over underlying transistor active regions 110 and 112, covering exposed drain area 125 (FIG. 9). The selected thickness of thin semiconductor film 120 is preferably less than about 1500 Angstroms.

Thin semiconductor film 120 is conductively doped to form an n-thin film channel region 122, a p+ thin film source region 124, and a p+ thin film drain region 126 of a thin film transistor (FIG. 10). More specifically, the entire semiconductor film 120 is first implanted with an n-type impurity such as phosphorous with a preferred dose of about 5 times $10^{12}$ ions/cm$^2$ at 25 KeV to create a conductively doped channel region 122 and to provide the desired thin film transistor gate threshold. Photoresist is then applied and patterned over channel region 122 and semiconductor film 120 is implanted with a p-type impurity such as boron difluoride at a preferred dose of about 2 times $10^{14}$ ions/cm$^2$ at 25 KeV to create conductively doped p+ thin film source and drain regions 124 and 126. Finally, photoresist is applied and patterned, and an n-type impurity such as phosphorous is implanted at a preferred dose of about 5 times $10^{14}$ ions/cm$^2$ at 25 KeV over exposed drain area 125 to create an n+ connecting region 130. Connecting region 130 overlies and contacts one of the underlying active regions, specifically underlying drain region 112, conductively connecting between one of the thin film active regions and the one underlying active region.

Thin film source region 124 contacts thin gate insulating layer 116 opposite underlying transistor source region 110. Thin film channel region 122 has a top region 140 and sidewall regions 142. Top region 140 contacts thin gate insulating layer 116 opposite transistor gate top surface 106. Sidewall regions 142 contact thin gate insulating layer 116 opposite transistor gate sidewalls 108. Thin film channel region 122 extends beyond transistor gate 104 toward thin film source 124 to form a source-gated region 146 which contacts thin gate insulating layer 116 opposite underlying active region 110. Underlying active region 110 in operation functions as a conductive gating region to gate the opposite thin film channel source-gated region 146 through thin gate insulating layer 116 as described more fully below. Thin film channel region 122 additionally includes an offset region 144 which contacts thin gate insulating layer 116 opposite underlying transistor drain region 112.

Thin film drain region 126 contacts thin gate insulating layer 116 opposite underlying transistor drain region 112. Thin film drain region 126 is adjacent to and contacts connecting region 130. Connecting region 130 therefore conductively connects thin film drain region 126 and underlying draim region 112, forming a parasitic diode junction in thin semiconductor film 120 between thin film drain region 126 and connecting region 130. Connecting region 130 has the same conductivity type as underlying transistor drain region 112 so that the diode is formed in thin semiconductor film 120 rather than at the junction of thin film 120 and underlying transistor drain region 112. This is desirable because of the lower diode voltage drop imposed by a thin film diode formed in polysilicon as opposed to the voltage drop imposed by a diode formed at exposed drain area 125.

Channel top region 140 is gated by transistor gate top surface 106 through thin gate insulating layer 116. Transistor gate sidewalls 108 in operation gate the opposite thin film channel sidewall regions 142 through thin gate insulating layer 116. Removing spacers 114 and utilizing gate sidewalls 108 to gate the opposite thin film transistor channel regions through the thin layer of insulation results in a much greater effective channel length than is the case with prior art thin film transistors which include spacers.

In addition, the construction described reduces or eliminates the effects of channel misalignment by providing source-gated region 146 which is always conductively gated. Thin film source region 124 and underlying source region 110 are conductively connected to different voltages. Underlying source region 110 is connected to $V_{ss}$ or ground and is thus at a low voltage relative to thin film source region 124 which is connected to $V_{cc}$, a positive logic voltage. Underlying source region 110 is similarly at a low voltage relative to channel source-gated region 146, thus creating a field through thin gate insulating layer 116 which conductively gates source-gated region 146. This gating is not possible with prior art circuits because of their relatively thick layer of isolation oxide.

Channel offset region 144 is also provided to reduce channel misalignment effects as well as to reduce thin film transistor leakage current as mentioned in the "Background" section above.

Because the thin film transistor and underlying MOSFET are of different conductivity types and are both gated by transistor gate 104, one of the transistors is turned on at any time. Therefore one of the two different voltages, $V_{cc}$ or $V_{ss}$ is produced at connecting region 130, depending on the voltage applied to transistor gate 104. A relatively high voltage applied to gate 104 conductively gates the channel region of the underlying n-channel MOSFET, turning the MOSFET on to result in a low voltage at connecting region 130. A relatively low voltage applied to gate 104 conductively gates thin film channel region 122, turning on the p-channel thin film transistor and resulting in a high voltage at connecting region 130.

Variations of the structure and methods described above are of course possible without departing from the invention principles. For instance, it is not strictly necessary that the thin film transistor thus far described be fabricated over an underlying MOSFET. However, in the absence of such an underlying transistor the source-gated region could be eliminated. Even without the source-gated region the thin film transistor allows for significant variation in channel alignment because of the greatly increased effective channel length as compared to prior art circuits. Alternatively, the source-gated region could be gated on by an appropriately biased underlying region other than a MOSFET active region.

As mentioned above, connecting region 130 is doped to the same conductivity type as underlying drain region 112 in order form a parasitic diode in thin film 120 rather than at exposed drain area 125. A thin film diode imposes a smaller voltage drop when forward biased than would a diode formed at exposed drain area 125. The diode voltage drop can be further reduced by providing a silicide diode shunt (not shown) which overlies and contacts thin film drain region 126 and connecting region 130. Such a diode shunt does not constitute a part of this invention, but is described in Applicant's concurrently filed application entitled "Self-Aligned Diode Shunt for Static RAM Thin Film Transistors," by the same inventor, which is hereby incorporated by reference.

Figure 11:
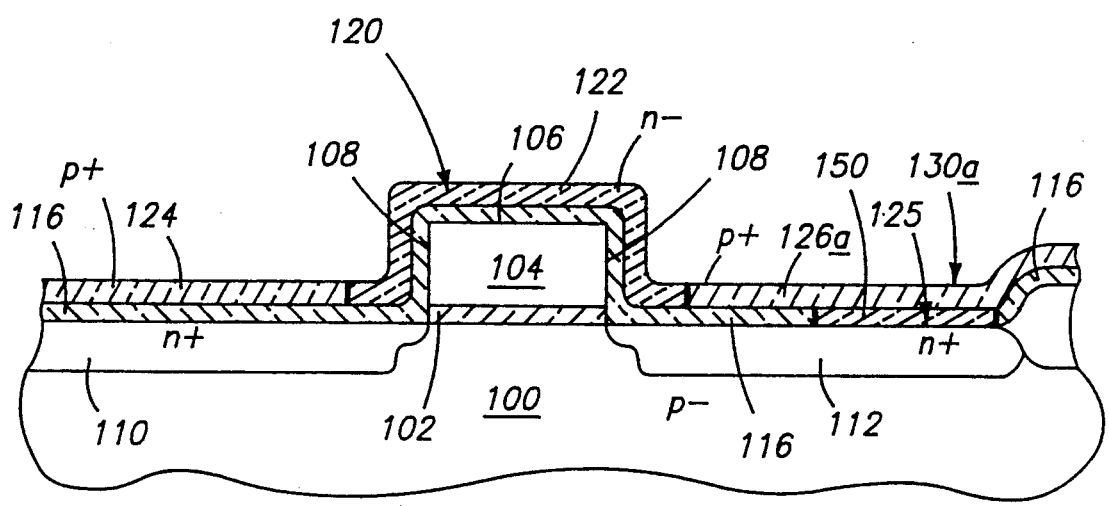
FIG. 11 is a diagrammatic section of an alternate embodiment of a CMOS circuit in accordance with the invention.

FIG. 11 shows an alternate embodiment of the invention which also eliminates the effect of the parasitic diode described above. The alternate embodiment is similar in most respects to the CMOS inverter already described. Regions and elements identical to those already described have been identically labelled. The circuit of FIG. 11 differs in the connection of thin film drain region 126a to underlying drain region 112. A silicide region or layer 150 is formed over exposed area 125 before forming thin semiconductor film 120. Rather than doping connecting region 130a to the same conductivity type as underlying drain region 112, connecting region 130a is left at the same conductivity type as adjacent thin film drain region 126a. Connecting region 130a overlies and contacts silicide region 150 to conductively connect thin film drain region 126a and underlying drain region 112.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a thin film field effect transistor on a semiconductor substrate comprising the following sequential steps:

forming a transistor gate on a semiconductor substrate, the transistor gate having a top surface and sidewalls;

providing sacrificial insulating spacers adjacent the transistor gate sidewalls;

doping the semiconductor substrate to form underlying transistor active regions, the sacrificial insulating spacers restricting doping thereunder, the transistor gate and underlying active regions forming an underlying field effect transistor;

substantially removing the sacrificial insulating spacers;

providing a thin gate insulating layer over the transistor gate, the thin gate insulating layer coating the transistor gate top surface and sidewalls, the thin gate insulating layer having a thickness which is less than about 700 Angstroms; and forming a thin semiconductor film over the transistor gate to a selected thickness, the thin film having a conductively doped thin film channel region and conductively doped thin film active regions, the thin film channel region contacting the thin gate insulating layer opposite the transistor gate top surface and opposite the sidewalls, the transistor gate sidewalls in operation gating the opposite thin film channel region through the thin gate insulating layer.

2. The method of forming a thin film transistor of claim 1 wherein the selected thickness of the thin semiconductor film is less than about 1500 Angstroms.

3. The method of forming a thin film transistor of claim 1 wherein the thickness of the thin gate insulating layer is greater than about 100 Angstroms.

4. The method of forming a thin film transistor of claim 1 wherein the thin film channel region contacts the thin gate insulating layer opposite one of the underlying active regions, the one active region in operation gating the opposite thin film channel region through the thin gate insulating layer.

5. A method of forming a CMOS inverter on a semiconductor substrate comprising the following steps:

forming a transistor gate on a semiconductor substrate, the transistor gate having a top surface and sidewalls;

providing sacrificial insulating spacers adjacent the transistor gate sidewalls;

doping the semiconductor base to form underlying transistor source and drain regions, the sacrificial insulating spacers restricting doping thereunder, the transistor gate and underlying source and drain regions forming an underlying field effect transistor;

substantially removing the sacrificial insulating spacers;

after substantially removing the sacrificial insulating spacers, providing a thin gate insulating layer which coats the transistor gate top surface and sidewalls, the thin gate insulating layer overlying and contacting the underlying source and drain regions, the thin gate insulating layer having a thickness which is less than about 700 Angstroms;

forming a thin semiconductor film over the transistor gate, the thin film being conductively doped to form a thin film channel region, a thin film source region, and a thin film drain region of a thin film transistor; the thin film source region contacting the thin gate insulating layer opposite the underlying source region; the thin film drain region contacting the thin gate insulating layer opposite the underlying drain region; the thin film channel region contacting the thin gate insulating layer opposite the transistor gate top surface and sidewalls; the thin film channel region contacting the thin gate insulating layer opposite the underlying source region; the transistor gate sidewalls in operation gating the opposite thin film channel region through the thin gate insulating layer; the underlying source region in operation gating the opposite thin film channel region through the thin gate insulating layer;

conductively connecting the thin film source region and the underlying source region to different voltages; and conductively connecting the thin film drain region and the underlying drain region together in produce one of the different voltages.

6. The method of forming a CMOS inverter of claim 5 wherein the thin semiconductor film has a thickness which is less than about 1500 Angstroms.

7. The method of forming a CMOS inverter of claim 6 wherein the thickness of the thin gate insulating layer is greater than about 100 Angstroms.

8. The method of forming a CMOS inverter of claim 6, the thin semiconductor film forming a connecting region overlying and contacting the underlying drain region to conductively connect the thin film drain region and the underlying drain region.

9. The method of forming a CMOS inverter of claim 5 wherein the underlying field effect transistor and the thin film transistor are of different conductivity types, the thin semiconductor film forming a connecting region overlying and contacting the underlying drain region to conductively connect the thin film drain region and the underlying drain region, the connecting region being of the same conductivity type as the underlying drain region to form a diode between the thin film drain region and the thin film connecting region.

10. The method of forming CMOS inverter of claim 5 further comprising:

exposing an area of the underlying drain region;

forming a silicide region over the exposed area of the underlying drain region before forming the thin semiconductor film; and the thin semiconductor film forming a connecting region overlying and contacting the silicide region to conductively connect the thin film drain region and the underlying drain region.

11. A thin film field effect transistor formed over an underlying field effect transistor comprising:

a transistor gate having a top surface and sidewalls;

underlying transistor active regions, the transistor gate and underlying active regions forming an underlying field effect transistor;

a thin gate insulating layer coating the transistor gate top surface and sidewalls, the thin gate insulating layer overlying and contacting the underlying active regions, the thin gate insulating layer having a thickness of less than about 700 Angstroms; and a thin semiconductor film provided over the transistor gate, the thin film having a conductively doped thin film channel region and thin film active regions, the thin film and channel region contacting the thin gate insulating layer opposite the transistor gate top surface and opposite the sidewalls, the transistor gate sidewalls in operation gating the opposite thin film channel region through the thin gate insulating layer, wherein the thin semiconductor film forms a connecting region overlying and contacting one of the underlying active regions to conductively connect one of the thin film active regions and the one of the underlying active regions 12. The thin film field effect transistor and underlying field effect transistor of claim 11 wherein the thin semiconductor film has a thickness which is less than about 1500 Angstroms.

13. The thin film field effect transistor and underlying field effect transistor of claim 11 wherein the thickness of the thin gate insulating layer is greater than about 100 Angstroms.

14. The thin film field effect transistor and underlying field effect transistor of claim 11 wherein the thin film channel region contacts the thin gate insulating layer opposite one of the underlying active regions, the one active region in operation gating the opposite thin film channel region through the thin gate insulating layer.

15. A CMOS inverter comprising:

a transistor gate having a top surface and sidewalls;

underlying transistor source and drain regions, the transistor gate and underlying source and drain regions forming an underlying field effect transistor;

a thin gate insulating layer coating the transistor gate top surface and sidewalls, the thin gate insulating layer overlying and contacting the underlying source and drain regions, the thin gate insulating layer having a thickness which is less than about 700 Angstroms; and a thin semiconductor film which is conductively doped to form a thin film channel region, a thin film source region, and a thin film drain region of a thin film transistor; the thin film source region contacting the thin gate insulating layer opposite the underlying source region; the thin film drain region contacting the thin gate insulating layer opposite the underlying drain region; the thin film channel region contacting the thin gate insulating layer opposite the transistor gate top surface and sidewalls; the thin film channel region contacting the thin gate insulating layer opposite the underlying source region; the transistor gate sidewalls in operation gating the opposite thin film channel region through the thin gate insulating layer; the underlying source region in operation gating the opposite thin film channel region through the thin gate insulating layer, the thin semiconductor film forming a connecting region overlying and contacting the underlying drain region to conductively connect the thin film drain region and the underlying drain region; and the thin film source region and the underlying source region being conductively connected to different voltages to produce one of the different voltages at the commonly connected thin film drain region and underlying drain region.

16. The CMOS inverter of claim 15 wherein the thin semiconductor film has a thickness which is less than about 1500 Angstroms.

17. The CMOS inverter of claim 15 wherein the thickness of the thin gate insulating layer is greater than about 100 Angstroms.

18. The CMOS inverter of claim 15 wherein the underlying field effect transistor and the thin film transistor are of different conductivity types, the connecting region being of the same conductivity type as the underlying drain region to form a diode between the thin film drain region and the thin film connecting region.

* * * * *